United States Patent
Gofman

(10) Patent No.: US 6,885,184 B1
(45) Date of Patent: Apr. 26, 2005

(54) GALVANICALLY ISOLATED VOLTAGE SENSING CIRCUIT

(75) Inventor: Igor Gofman, Croton-on-Hudson, NY (US)

(73) Assignee: Asco Power Technologies, L.P., Florham Park, NJ (US)

( * ) Notice: Subject to any disclaimer, the term of this patent is extended or adjusted under 35 U.S.C. 154(b) by 0 days.

(21) Appl. No.: 10/814,400

(22) Filed: Mar. 31, 2004

(51) Int. Cl.[7] .............................................. G01R 19/22
(52) U.S. Cl. .................... 324/118; 324/765; 324/158.1
(58) Field of Search ............................ 324/118, 158.1, 324/120, 73.1; 329/352, 369, 366; 327/93, 427, 432; 323/315, 316, 277

(56) References Cited

U.S. PATENT DOCUMENTS 5,917,379 A * 6/1999 Ashby et al. ............... 330/260
6,590,379 B1 * 7/2003 Mercier ....................... 324/118

* cited by examiner

*Primary Examiner*—David Zarneke
*Assistant Examiner*—Jimmy Nguyen
(74) *Attorney, Agent, or Firm*—McDonnell Boehnen Hulbert & Berghoff LLP

(57) ABSTRACT

Method and apparatus for galvanically isolated voltage sensing circuit. A circuit includes a scaling device that provides a scaled signal of an input voltage to a modulator. An oscillator provides a carrier frequency to the modulator, the modulator modulating the scaled signal with the carrier frequency to produce a modulated scaled signal. An isolation transformer is coupled to an output of the modulator. The isolation transformer receives the modulated scaled signal. A demodulator is coupled to an output of the isolation transformer and demodulates the modulated scaled signal to produce an input voltage signal representative of the scaled signal.

22 Claims, 7 Drawing Sheets

Figure 4 (a-h)

GALVANICALLY ISOLATED VOLTAGE SENSING CIRCUIT

FIELD OF THE INVENTION

The present invention generally relates to voltage sensing circuitry and, in particular, a galvanically isolated voltage sensing circuit for monitoring a low frequency analog signal. In one arrangement, a voltage sensing circuit is applied for Alternating Current ("AC") Line monitoring devices.

BACKGROUND

Certain industrial applications require AC line voltage sensing for operation and control. However, under certain scenarios, AC line voltage can be extremely dangerous especially to a user or operator of the system. One possible method of protecting users from a potential electric shock is to galvanically isolate the AC source (e.g., AC line voltage) from the control circuit that monitors the AC line voltage. The AC Line voltage can be very high, for example on the order of 500 $V_{rms}$ or higher. Therefore, the monitored line voltage is preferably adapted (i.e., the monitored line voltage is preferably scaled down or reduced) for use with a low voltage monitoring circuit, such as a low voltage monitoring circuit that comprises semiconductor components.

A typical method of isolating and reducing a primary AC line voltage is by way of a step-down isolation transformer. The use of such isolation transformers presents both advantages as well as disadvantages. For example, one advantage of such an isolation method is that that low frequency transformers (50/60 Hz) are typically quite linear and relatively stable. However, these low frequency transformers are also generally large, heavy and expensive, especially for high input voltages such as voltages on the order of approximately 500 $V_{rms}$. Those transformers are not used as power transformers, because the voltage-monitoring device (as will be explained with respect to FIG. 1a) draws a relatively insignificant amount of current. For example, such a voltage-monitoring device may draw current on the order of a few micro-amps.

FIG. 1a illustrates a first typical voltage sensing circuit 10. Sensing circuit 10 comprises a high input voltage 12, a first typical isolation step-down transformer 14, and a voltage monitoring device 18. Isolation step-down transformer 14 steps down or reduces high input voltage 12 to a lower voltage or a scaled voltage 16. This scaled down voltage 16 may then be safely applied to voltage monitoring device 18.

Hence, the isolation transformers are deemed to be small, because they typically require just a few milli-watts of power under normal operating conditions. Nevertheless, under certain practical applications, isolation transformers can become rather large. For example, in certain industrial applications where 50/60 Hz three-phase power lines are used, these lines carry up to 680 $V_{rms}$ and perhaps even higher voltages in certain applications. Despite relatively low transformer wattage requirements, the primary winding of a step-down transformer requires thousands of turns to meet a minimum required ratio "Turns per Volts". This can be seen where the number of primary turns N of a transformer is represented by the following equation:

$$N=(Vin \cdot 10^8)/(4.44fAB)$$

where N=Number of primary turns; Vin=Primary Voltage; f=line-frequency; A=core cross-section Area; and, B=max. flux, in lines. In other words, the number of primary turns is proportional to the input voltage (E) and is in inversely proportion to the relative size of transformer (A). Consequently, a smaller transformer will require more turns for the same voltage, as well, a higher voltage requires more turns. Thousands of turns take additional space, resulting in these types of step-down transformers being heavy, generally expensive, and requiring a relatively large footprint.

One alternative to using an isolation step-down transformer, such as the transformer illustrated in FIG. 1a, is to provide a voltage divider network. Such a voltage divider network provides a reduced or a low scaled voltage to the voltage monitoring device. One arrangement of such a voltage divider based voltage sensing circuit 20 is illustrated in FIG. 1b. A typical isolation transformer (such as transformer 14 of FIG. 1(a)) may be replaced with a miniature low voltage isolation transformer, if input voltage 22 is reduced by voltage divider such that a reduced voltage is applied across a miniature isolation transformer 26. For example, in one arrangement, an exemplary miniature isolation transformer will have a primary inductance of approximately ($\approx$1–2 mH) and have a relatively small footprint. Such a footprint will be on the order of approximately 0.25 sq.in. or less.

Voltage sensing circuit 20 illustrated in FIG. 1b includes a high voltage input 22, a resistive voltage divider 24, and a miniature isolation transformer 26. Resistive voltage divider 24 is coupled in series to miniature isolation transformer 26 to reduce high voltage input 22. In one arrangement, miniature isolation transformer 26 comprises a miniature surface mount isolation transformer. One such miniature isolation transformer is manufactured by HALO, Electronics, Inc. of Mountainview, Calif. and bears Part Number: TGR-3755NC. Such a miniature isolation transformer has a primary inductance of L$\approx$1 mH.

The input impedance of miniature transformers at a frequency of f=50 Hz is relatively low and can be computed based on the following:

$$Z=2*\pi*f*L=2*3.14*50*(1*10^{-3})=0.314 \text{ } Ohm$$

where Z is the transformer impedance, f is the signal frequency, and L is the transformer inductance. For accuracy, resistive voltage divider R 24 shall be selected to dissipate a minimum amount of power, thereby reducing voltage divider self-heating. In one arrangement, the power dissipation is chosen so as not to exceed 0.25 Watts. If it is assumed that the high voltage input 22 is chosen to equal 680 $V_{rms}$ and the resistor power dissipation is 0.25 Watts, the voltage divider power may be calculated as follows:

$$P = \frac{V^2}{R}$$

Where V is the input line voltage and R is the divider resistance. So, in order not to exceed a power dissipation of 0.25 Watts, the resistance R shall be at least:

$$R \leq \frac{V^2}{P} = \frac{680^2}{0.25 \text{ W}} \approx 2 \text{ M Ohm}$$

And the current of the miniature isolation transformer 26 may then be calculated as follows:

$$I = \frac{V}{R} = \frac{680 \text{ V}}{2 \text{ M Ohm}} \approx 340\mu \text{ A}$$

The input voltage applied to the miniature isolation transformer 26 is:

V=Z*I=0.314 *Ohm*\*340 μA≈107 microvolts

The signal magnitude (V≈107 microvolts) is comparable to the magnitude of typical industrial electrical or electromagnetic interference. Therefore, in this scenario, if the voltage signal's magnitude is generally equal to a noise magnitude, the resulting Signal/Noise ratio approaches unity. Consequently, since it is generally known that an acceptable "Signal/Noise Ratio" is generally on the order of 40–120 db (100–1000 times), a Signal/Noise Ratio=1 is generally unacceptable.

The precision of measurement is generally poor and unreliable. If the noise magnitude is essentially equal to the signal magnitude, the measurement error is 50%. Therefore, a better Signal/Noise Ratio will reduce the measurement error. This poor signal/noise ratio therefore makes the resistive voltage divider 24 difficult to use for a scale (reduce) the line voltage. Therefore, a low inductance miniature transformer cannot be used at the industrial frequency (i.e., 50/60 Hz) as an isolation device since its impedance is too low to provide a significant voltage level (Signal/Noise ratio) for the accurate measurement by voltage sensing device 30.

From the previous discussion, it can be noted that the linearity and the isolation properties of transformers are generally predictable. Transformers can provide precision scaling for measurements and they are preferable devices for isolation in most typical cases. However, the size, footprint, weight and cost of these transformers complicate their usage for voltage monitoring, especially when the size of the overall voltage sensing circuit tends to be critical.

There is, therefore, a general need for a voltage sensing technique that overcomes the foregoing concerns. There is a further need for a voltage sensing circuit that provides high voltage monitoring by implementing a miniature, cost effective isolation transformer while also producing acceptable and accurate voltage sensing measurements.

SUMMARY

According to an exemplary embodiment, a galvanically isolated voltage sensing circuit comprises a scaling device that provides a scaled signal of a input voltage to a modulator. An oscillator provides a carrier frequency to the modulator. The modulator modulates the signal with the carrier frequency to produce a modulated scaled signal. An isolation transformer receives the modulated scaled signal. A demodulator demodulates the modulated scaled signal to produce an input voltage signal representative of said scaled signal.

In an alternative embodiment, a method of galvanically isolating a voltage comprises the steps of providing a scaled signal of an input voltage to a modulator. A carrier frequency is provided to the modulator. A modulated scaled signal is produced by modulating the scaled signal with the carrier frequency. The method also includes the step of coupling an isolation transformer to the modulator and a demodulator. The isolation transformer receives the modulated scaled signal and the modulated scaled signal is demodulated to produce a line voltage signal representative of the scaled signal.

In yet another alternative embodiment, a voltage sensing circuit comprises a scaling device that includes a high impedance voltage divider coupled to a buffer. A modulator is coupled to an output of the scaling device and receives a DC bias. An oscillator is coupled to the modulator. A miniature isolation transformer is coupled to an output of the modulator and a demodulator is coupled to an output of the miniature isolation transformer. The demodulator comprises a linear rectifier, a low pass filter, and a DC component blocker. The demodulator demodulates an input and generates a scaled output line voltage.

BRIEF DESCRIPTION OF THE DRAWINGS

An exemplary embodiment of the present invention is described herein with reference to the drawings, in which.

DETAILED DESCRIPTION

Figure 2:
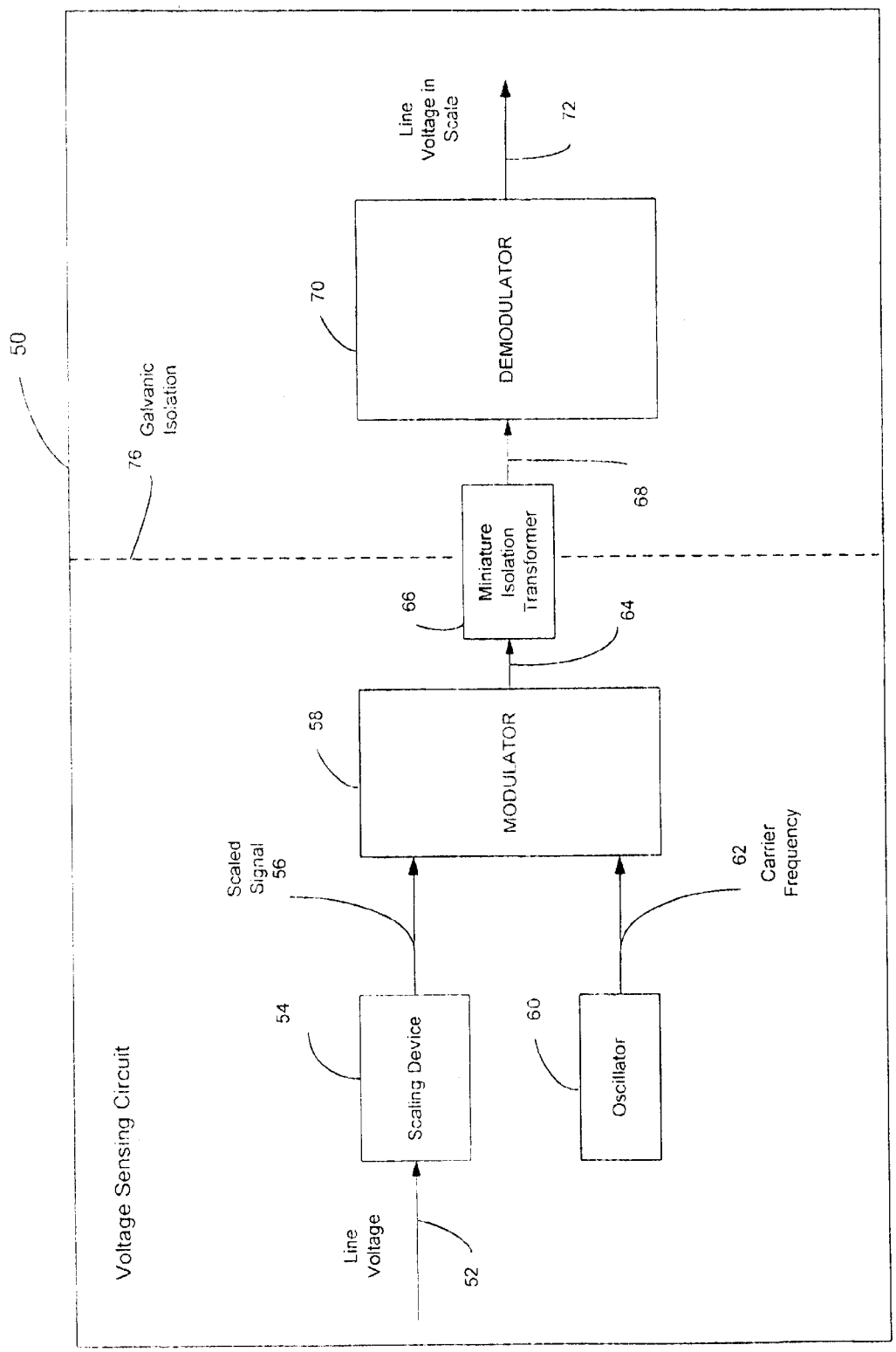
FIG. 2 illustrates a simplified diagram of a voltage sensing circuit incorporation aspects of the present invention.

FIG. 2 illustrates a general overview representation of a voltage sensing circuit 50 incorporating aspects of the present invention. As shown in FIG. 2, voltage sensing circuit 50 comprises a scaling device 54, a modulator 58, and an oscillator 60. Modulator 58, which receives a scaled line voltage 56 from scaling device 54 and a carrier frequency from oscillator 60, is coupled to a miniature isolation transformer 66. Miniature isolation transformer 66, which provides galvanic isolation 76 to voltage sensing circuit 50, is electrically coupled to a demodulator 70 which provides the line voltage in scale 72.

Line voltage 52 is provided to an input of scaling device 54. An output of scaling device 54 is connected to the input 101 of modulator 58. Scaling device 54 reduces or scales line voltage 52 to a low voltage level signal, such as scaled line voltage 56. Preferably, scaling device 54 reduces line voltage 52 to a low voltage level acceptable to semiconductors devices, such as, for example, on the order from about 0.5 to about 10 Volts. Scaling device 54 may comprise either a resistive or a capacitive voltage divider. Preferably, modulator 58 has a high input impedance (for example, on the order of about 1 to about 50 M Ohm), so that the modulator input voltage will not be limited to a microvolt input level.

The second input of the modulator 58 is coupled to an output of oscillator 60. Oscillator 60 provides a carrier frequency 62. Carrier frequency 62 exceeds a frequency of line voltage 52. For example, in one arrangement, carrier frequency 62 may be provided in accordance with the Shannon-Kotelnikov Sampling Theorem which is herein entirely incorporated by reference and to which the reader is directed for further information.

(http://www.math.ut.ee/~toomas__1/harmonic__analysis/Fourier/node33.html).

Based in part on the Shannon-Kotelnikov Sampling Theorem, carrier frequency 62 is chosen to be higher than a frequency of line voltage 52. For example, in one preferred arrangement, carrier frequency 62 is chosen to reside within the range from about 1 MHz to about 100 MHz. Other frequency ranges may also be chosen. Modulator 58 comprises an AM modulator or alternatively, modulator 58 comprises an FM modulator. Consequently, modulator 58 uses scaled signal 56 to modulate a carrier frequency 62. The resulting modulated scaled line voltage signal 64 is then input to miniature isolation transformer 66. It is this miniature isolation transformer 66 that enables voltage sensing circuit 50 to provide galvanic isolation 76. Unlike at low frequency operation (e.g., 50/60 Hz) as previously discussed with regard to FIG. 1(b); the input impedance of miniature isolation transformer 66 (at the carrier frequency 62) will now be much higher then if the miniature isolation transformer were operated at 50 Hz.

For instance, in an arrangement where oscillator 60 provides a carrier frequency 62 of 2 M Hz, for a miniature transformer having an inductance on the order of L=1 milli_Henry, the input impedance of miniature isolation transformer 66 may be computed as follows:

$$Z = 2*\pi*f*L = 2*3.14*(2*10^6)*(1*10^{-3}) = 12,560 \; Ohm$$

As can be seen, the input impedance of the miniature transformer 66 at 2 MHz is now 12,560 Ohms versus an impedance of 0.314 Ohms previously calculated for standard operation at 50 Hz. Increasing the transformer input impedance will tend to reduce the above-mentioned limitations for the miniature transformer working at a low industrial frequency.

Figure 1:
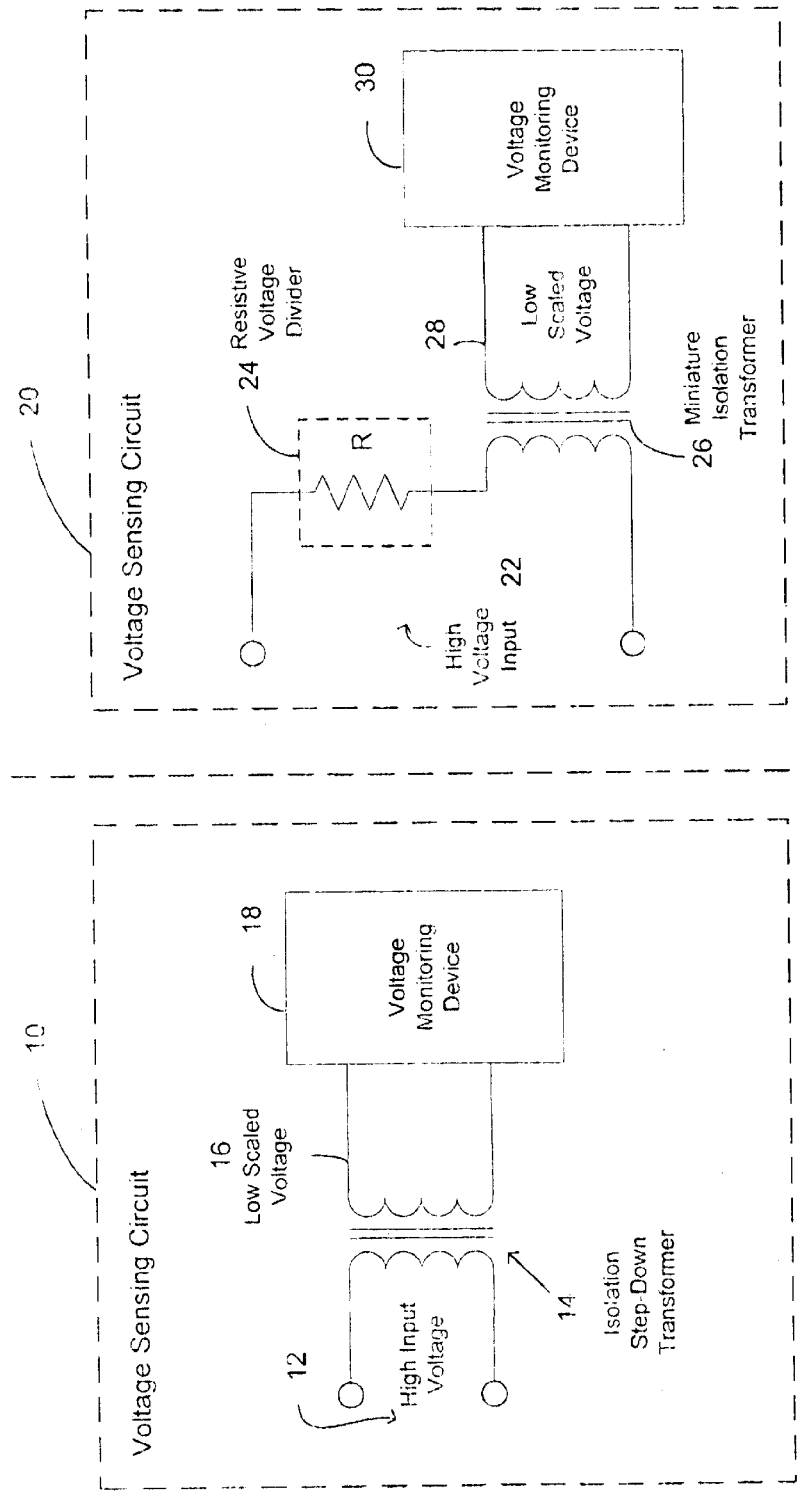
FIG. 1*a* illustrates a typical voltage sensing circuit.
FIG. 1*b* illustrates yet another typical voltage sensing circuit.

At the same input current of 340 µA (as it was computed above for the resistive divider network illustrated in FIG. 1(b)), the input voltage for the miniature transformer will now be:

$$V = Z*I = 12,560 \; Ohm * 340 \; \mu A = 4.27 \; V$$

This voltage is roughly 40,000 times greater than the corresponding voltage for the 50 Hz operation. This higher voltage of 4.27 V provides an improved Signal/Noise ratio and consequently results in more accurate voltage monitoring. For instance, if the industrial electrical/electromagnetic noise is on the order of 107 microvolts, (as previously discussed), the Signal/Noise=4.27 V/107 uV≈40,000 versus 1 for the 50 Hz transformer. Consequently, the measurement error will be reduced on the order of 40,000 times.

The modulated scaled line voltage signal 68 produced by transformer 66 is received by demodulator 70. Depending on the type of modulation implemented by modulator 58, demodulator 70 may take various forms. For example, demodulator 70 may comprise an AM Balanced Demodulator, Precision Rectifier with Low Pass filter, or a FM Demodulator. Demodulator 70 produces a scaled line voltage signal 72, which is representative of scaled voltage signal 56 and therefore a scaled version of line voltage 52.

Figure 3:
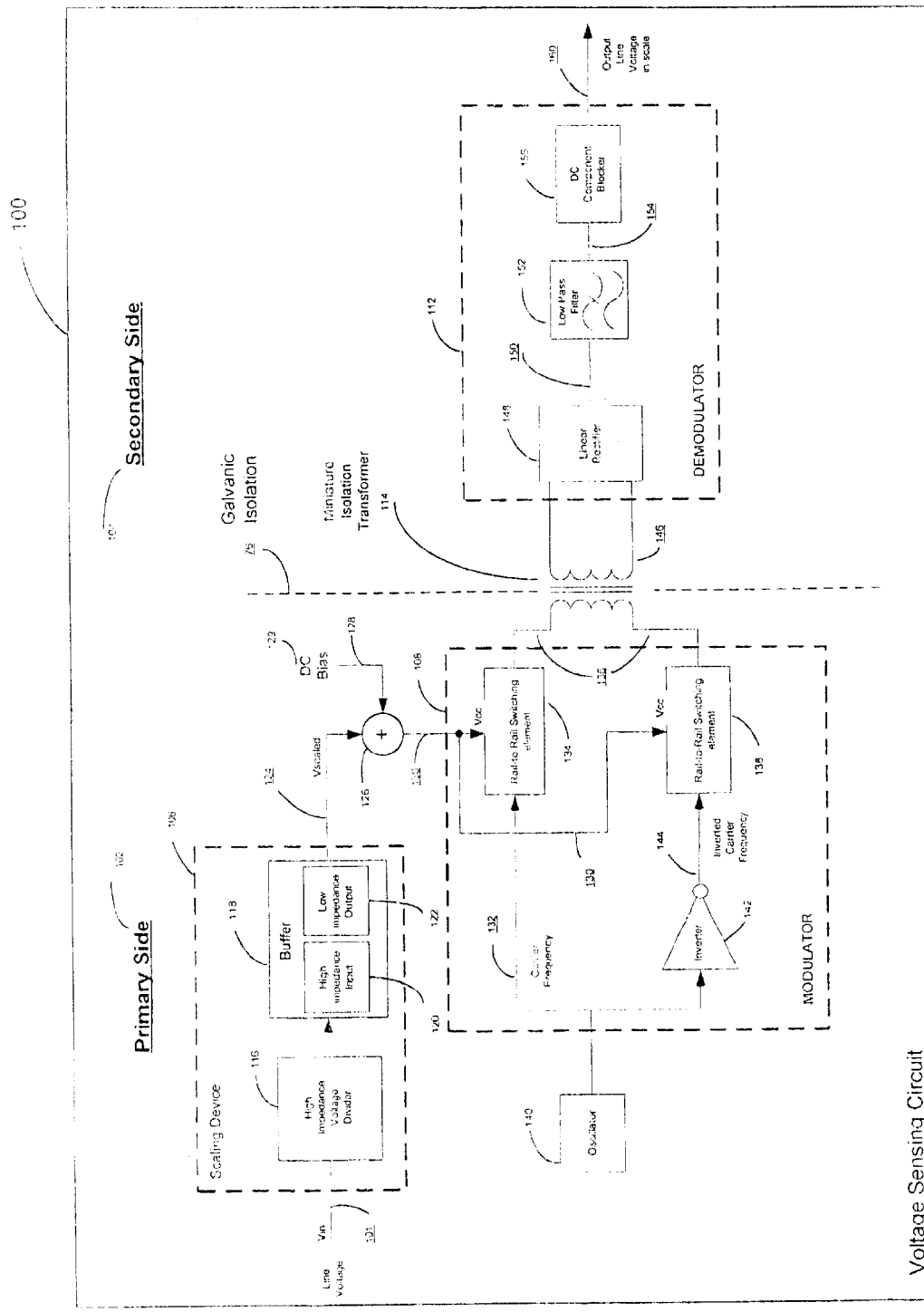
FIG. 3 illustrates a detailed block-diagram of the voltage sensing circuit illustrated in FIG. 2.
Figure 4:
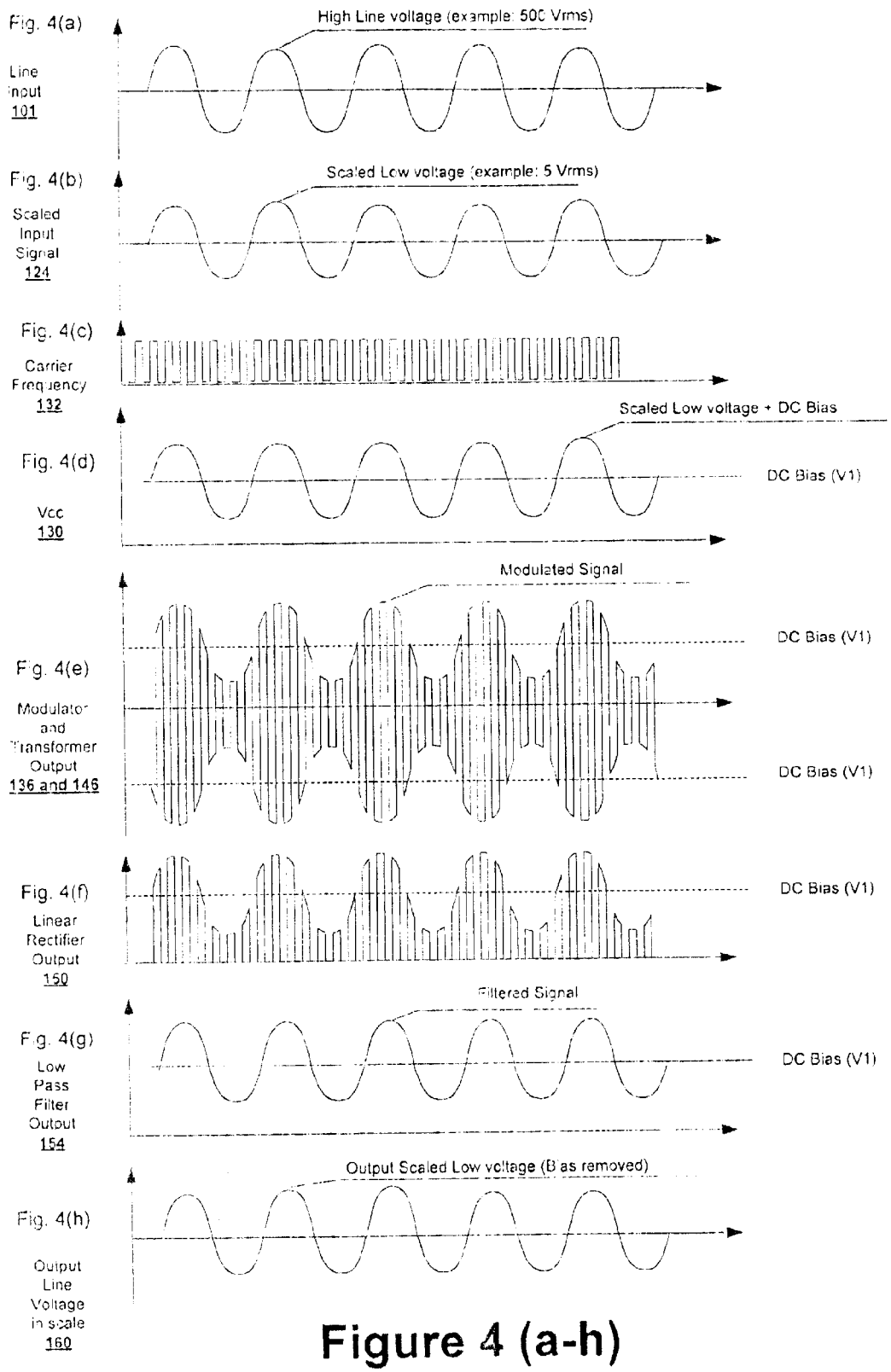
FIGS. 4(*a*–h) illustrate various timing diagrams of the voltage sensing circuit illustrated in FIG. 2.

FIG. 3 illustrates a block-diagram 100 illustrating a first arrangement for a voltage sensing circuit, such as the voltage sensing circuit 50 illustrated in FIG. 2. Block diagram 100 provides a preferred arrangement for signal processing and transmission of a low frequency line voltage, and provides a galvanic isolation 76 between line voltage $V_{in}$ 101 and a voltage sensing circuit by using a miniature isolation transformer 114. FIGS. 4(a–h) illustrate various timing diagrams generated by the voltage sensing circuit 100 illustrated in FIG. 3.

Voltage sensing circuit 100 includes a primary side 102 and a secondary side 104 which are separated by galvanic isolation 76. Primary side 102 comprises a scaling device 106, a modulator 108, and an oscillator 140. Primary side 102 is galvanically isolated from secondary side 104 via miniature isolation transformer 114. Primary side 102 receives a line voltage $V_{in}$ 101. In one preferred arrangement, and as illustrated in FIG. 4(a), such a line input voltage comprises a sinusoidal voltage of, for example, 500 $V_{rms}$. Secondary side 104 comprises a demodulator 112 coupled to primary side 102 via isolation transformer 114.

In one preferred arrangement, scaling device 106 comprises a high impedance voltage divider 116 and a buffer 118, where buffer 118 comprises a high impedance input 120 and a low impedance output 122. High impedance voltage divider 116 receives line voltage $V_{in}$ 101 and reduces the line voltage to an appropriate voltage level. Preferably, voltage divider 116 reduces $V_{in}$ 101 to a voltage level suitable for semiconductors such as on the order of about 0.5–10 Volts. The resistance of high impedance voltage divider 116 may be chosen so as to be large enough to eliminate self-heating. For example, in the arrangement shown in FIG. 3, if the line voltage $V_{in}$ 101 is received as shown in FIG. 4(a), in one arrangement, the high impedance voltage divider may reduce the $V_{in}$ to a scaled input signal 124 as illustrated in FIG. 4(b). In this arrangement, where $V_{in}$ 101 is equal to about 500 $V_{rms}$, the scaled low voltage 124 will be approximately 5 $V_{rms}$.

High impedance divider 116 is loaded with buffer 118. Buffer 118 preferably has a high input impedance 120 and a low output impedance output 122. Buffer 118 eliminates a loading effect to divider 116 while also providing for a generally high degree of accuracy in measurement. The impedance of the buffer 118 acts as a parallel resistor to high impedance voltage divider 116. Therefore, the input impedance of the buffer 118 will tend to alter voltage divider's 116 ratio and also effect measurement accuracies. To avoid this concern, the input impedance of buffer 118 shall be high, for example, on the order of approximately 50 to about 100 M Ohm.

Buffer 118 generates an output $V_{scaled}$ 124 and this scaled voltage $V_{scaled}$ 124 is provided as a first input to an adder 126. A DC bias 129 provides as a bias signal 128 and it is applied as a second input 128 to adder 126. Adder 126 provides for the addition of two signals, that is $V_{scaled}$ 124 and a DC bias signal 128 generated by DC bias 129. As a result, signal 130 which is output from adder 126 and provided to modulator 108, represents a sum of the scaled input voltage 124 and DC bias 129. This combined signal 130 is then provided as an input to modulator 108. FIG. 4(d) illustrates one possible embodiment of combined signal 130. As shown in FIG. 4(d), signal 130 is represented a scaled low voltage 124 offset by an amount of DC Bias Signal 128.

Returning to FIG. 3, modulator 108 comprises a first rail-to-rail switching element 134, an inverter 142, and a second rail-to-rail switching element 134. Signal 130 supplies power to the first and the second rail-to-rail switching elements 134, 138, respectively. Basically, rail-to-rail switching elements 134, 138 act as amplifiers (with a very high gain) that has a maximum output signal amplitude clamped to the supply voltage. In other words, the output signal tracks an input signal, but does not exceed a supply voltage. For instance, in an arrangement where the input signal is 0.5 $V_{rms}$, a gain is 100,000, and a supply voltage is 12V, the output voltage will not be 50000 V=0.5 V*100000. Rather, the maximum voltage will be limited to the supply voltage: 12 V.

Oscillator 110 provides a carrier frequency 132 to the first rail-to-rail switching element 134. For example, FIG. 4(c) illustrates one example of a carrier frequency 132. However, as those of ordinary skill in the art will recognize, other types of carrier frequency arrangements may also be used.

This same carrier frequency 132 is input to an inverter 142 and this inverter provides an inverted carrier frequency 144 to the second rail-to-rail switching elements 138. Both first and second rail-to-rail switching elements 134, 138 pass a carrier frequency 132 from input to output.

FIG. 4(e) illustrates the modulator and transformer output signals 136, 146, respectively. As shown in FIG. 4(e), signal 130 does not cross the zero line because in this arrangement, where the DC Bias voltage is V1, the scaled low voltage in sum with this DC Bias will be greater than 0 for all values. This also means that the rail-to-rail switching elements 134 and 138 will always be active and will therefore pass carrier frequency 132 from input to output.

As shown in FIG. 4(e), the rail-to-rail switching elements 134, 138 pass input frequency to a primary side of isolation transformer 114. Outputs 136, 146 of rail-to-rail switching elements 134, 138 generally follow signal 130. However, outputs 136, and 146 are chopped with the high frequency carrier signal 132. Rail-to-rail switching element 138 receives carrier frequency 132 which is inverted by inverter 142. Therefore, the output signal 136 of modulator 108 provided to transformer 114 will have opposite phases. Consequently, transformer 114 provides a linear signal transmission along with galvanic isolation.

As illustrated in FIG. 4(e), output signal 146 repeats signal 136. Demodulator 112 is connected to a secondary side of transformer 114. In the arrangement illustrated in FIG. 3, demodulator 112 comprises a linear rectifier 148 coupled to a low pass filter 152 which in turn is coupled to a DC component blocker 156.

Linear rectifier 148 passes only the positive portion of signal 146. The resulting output signal 150 appears to still be chopped with the carrier frequency 132 from the modulator 108. FIG. 4(f) illustrates linear rectifier output signal 150. To eliminate this high frequency component of linear rectifier output signal 150, signal 150 is input to a low pass filter 152. After low pass filtering, the output of low pass filter represents the signal 154 illustrated in FIG. 4(g). As can be seen from FIG. 4(g), low pass filter output signal 154 has essentially the same form and magnitude as linear rectifier output signal 150 (FIG. 4(f)) and as signal 130 on primary side 102 of voltage sensing circuit 100.

Low pass filter output signal 154 is provided to a DC component blocker 156. DC component blocker 156 blocks or cuts a DC component (i.e., DC Bias) present in signal 154. Consequently, output line voltage in scale signal 160 illustrated in FIG. 4(h) is equivalent to signal 124 and represents the scaled input signal 101 in FIG. 4(a). Therefore, voltage sensing circuit 100 provides an output line voltage in scale and that is galvanically isolated from the line voltage 101 and the primary side 102 of voltage sensing circuit.

Figure 5:
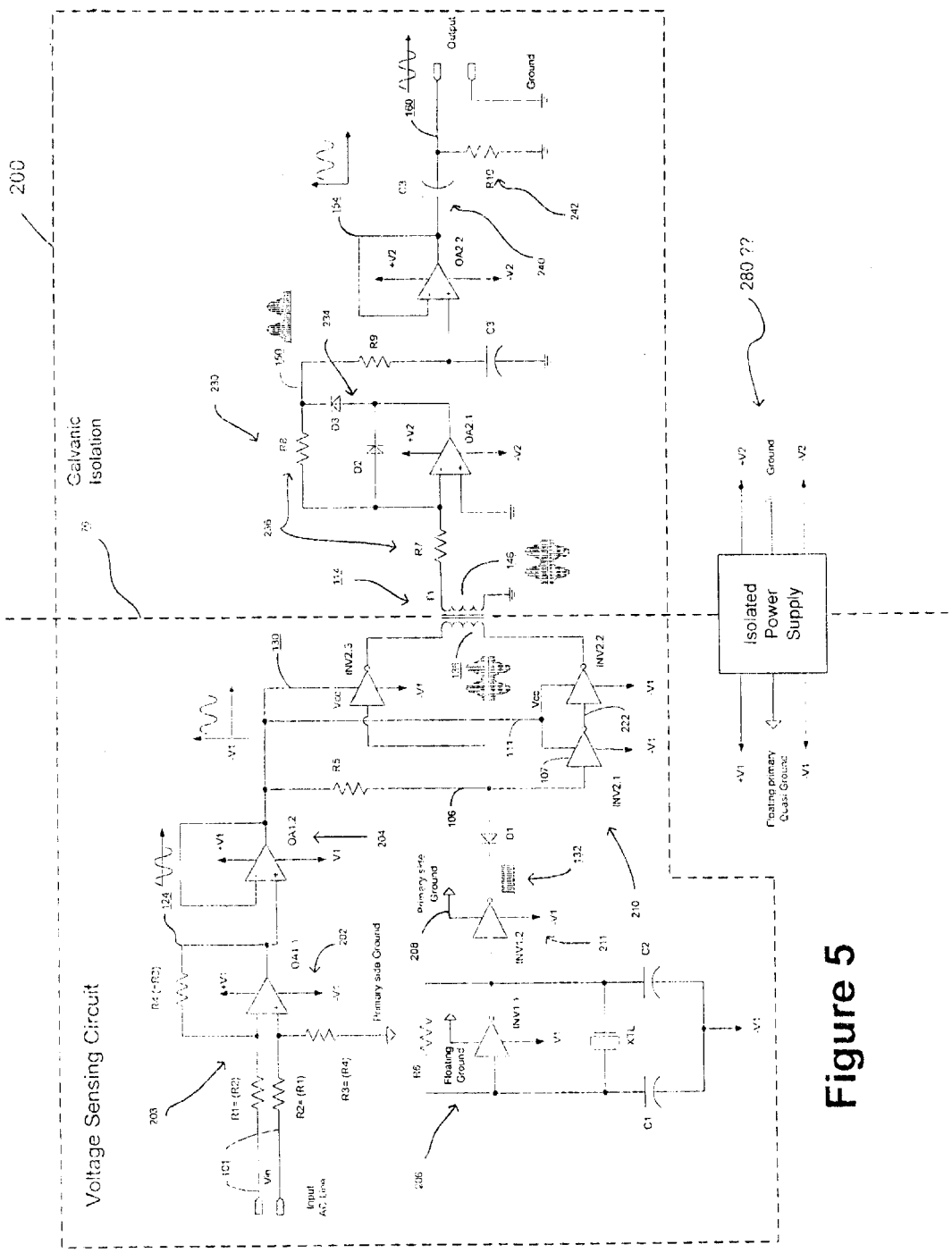
FIG. 5 illustrates a schematic diagram of the voltage sensing circuit illustrated in FIG. 2.

FIG. 5 illustrates an exemplary electrical schematic diagram 200 of voltage sensing circuit 50 illustrated in FIGS. 3 and 4. In FIG. 5, an input AC Line voltage 101 is applied to a Differential Operational Amplifier OA1.1 202 via resistive divider R1-R2-R3-R4 203.

Assuming that R1=R2 and R3=R4, the input signal 101 will be scaled or reduced by the following ratio:

$$\text{RATIO} = \frac{R1}{R4} = \frac{R2}{R3}$$

The magnitude of the scaled signal 124 ($V_{SCALED}$) may be computed as follows:

$$V_{SCALED} = \frac{R4}{R1} * V_{IN}$$

Resistors R1 and R3 will have a high value (for instance, R1 and R3 may have a resistance on the order of about 1 to about 10 Mega-Ohm). Therefore, the input impedance of the voltage sensing circuit 200 will be high, on the order of R1+R2. Operational Amplifier OA1.2 204, which receives the scaled input voltage signal 124, is used as a buffer to provide a high input and a low output impedance.

High frequency oscillator 206 contains a CMOS inverter INV1.1, crystal XTL, and resistor R6. The positive supply voltage for the inverters INV1.1–INV1.2 is a Primary side Ground 208, and the common is a negative supply voltage −V1. In reference to the negative supply voltage (−V1), the scaled signal 130 has a DC bias:

$$\text{BIAS}=0-(-V1)=V1$$

The carrier frequency 132 is generated by INV1.2 211 and is provided to another group of CMOS inverters INV2.1–INV2.3 210. These inverters INV2.1–INV2.3 210 are used as a driver for miniature isolation transformer 114. The supply voltage Vcc for this group of inverters INV2.1–INV2.3 210 is provided by Operational Amplifier OA1.2 204. In reference to the negative voltage (−V1), this signal is a resulting voltage of both AC and DC components:

$$V_{CC}=V_{SCALED}+V1$$

To keep the various CMOS elements in working condition, it is preferred that the $V_{CC}$ voltage is maintained within a voltage range, such as the following voltage range:

$$+3\ V<V_{CC}<+18\ V$$

Therefore, and assuming that input AC line signal 101 is a sinusoidal input, V1 should reside within the following range:

$$3\ \text{Volts}+V_{SCALED}*\sqrt{2}<V1<18\ \text{Volt}-V_{SCALED}*\sqrt{2}$$

The resulting voltage $V_{CC}$ is a sum of alternating current and direct current components. In other words, the DC voltage V1 is amplitude-modulated by the scaled signal 130. CMOS inverters 210 act as both the first and the second rail-to-rail switching elements 134, 138 illustrated in FIG. 3. The highest level of the output signal will be equal to the supply voltage $V_{CC}$. Signal 222 is an inverted carrier frequency signal 106. So, the output signals of INV2.2 and INV2.3 are opposite and have amplitudes that are generally proportional to the scaled input signal 130.

Hence, the group of inverters INV2.2 and INV2.3 work as a bridge amplifier with a single Gain. During operation, the carrier frequency 132 from INV1.2 211 can exceed the $V_{CC}$ voltage (signal 130). To prevent inverters INV2.1–INV2.3 from damage, a blocking diode D1 and bias resistor R5 are preferably used.

The amplitude-modulated signal 136 is applied to an input of miniature isolation transformer T1 114. Transformer T1 114 acts as an isolation transformer and therefore preferably has a turns ratio on the order of 1:1. Therefore, the transformer T1 114 provides an output signal 146 that is generally equivalent to the input signal 136. Signal 146, therefore, is galvanically isolated from the voltage source. To restore the original reduced signal 124, the output transformer signal 146 is rectified and filtered as previously discussed.

To accomplish this rectification and filtering, linear rectifier 230 contains operational amplifier OA2.1, Diodes D2–D3 234, and resistors R7–R8 236. Preferably, operational amplifier OA2.1 has a high Gain to eliminate a non-linearity of diodes 234. More preferably, linear rectifier cuts the negative part of the signal 114 to produce signal 150.

An RC low-pass filter cleans signal 150 from carrier frequency 132. The filtered signal is provided to a buffer OA2.2, which has very high input impedance, for example, on the order of 100 MOhm. The signal 154 does not appear chopped, although the signal 154 will still have a DC component (i.e., V1) that is equal to the voltage V1. To remove this DC component, a blocking capacitor C3 240 and discharging resistor R10 242 are preferably used. The resulting signal 160 is essentially a representation of scaled voltage signal 124. Isolated power supply 280 provides a schematic representation of the galvanically isolated voltage circuit 200.

Figure 6:
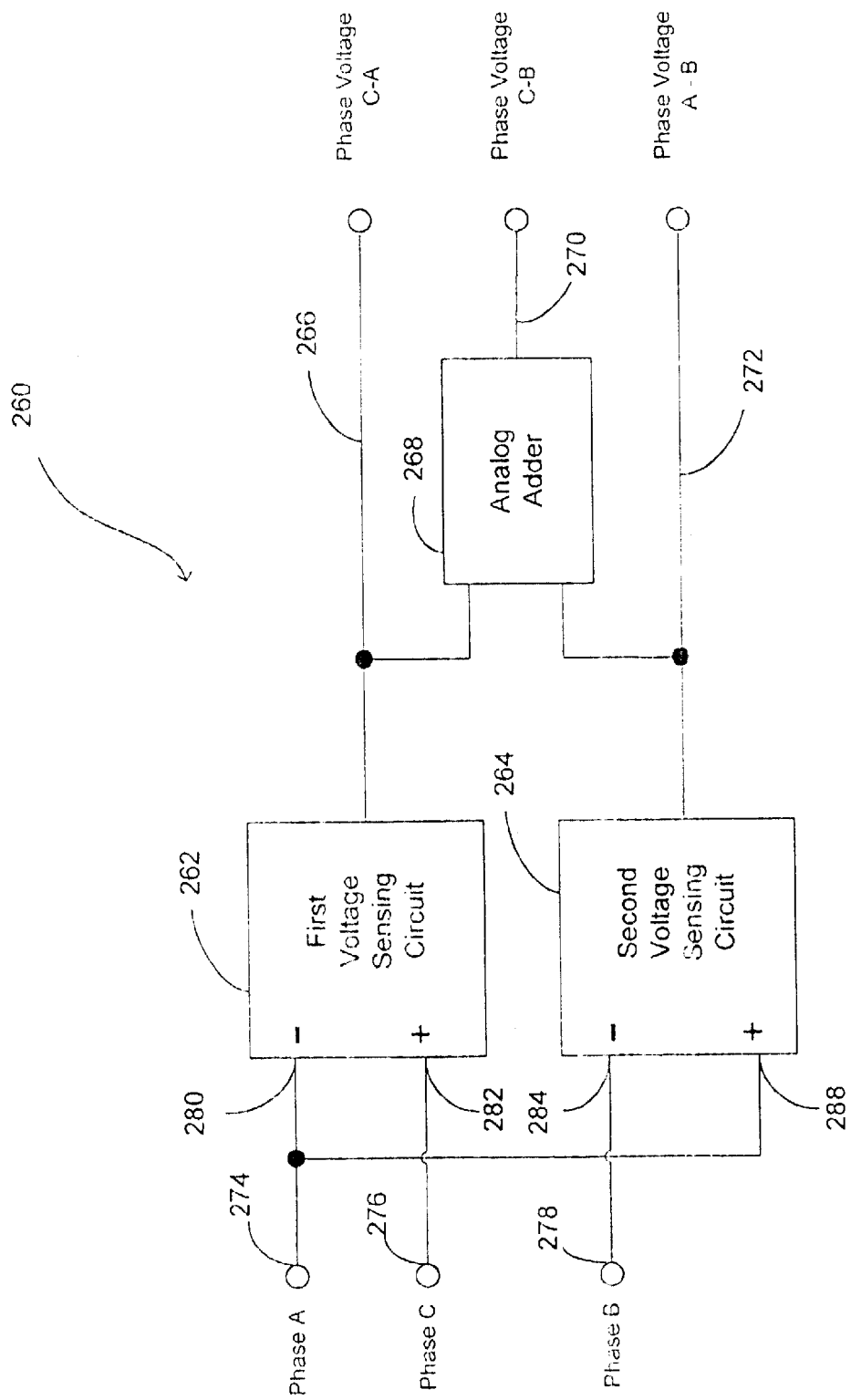
FIG. 6 illustrates an exemplary block diagram of a three-phase voltage sensing circuit incorporating aspects of the present invention.

In an alternative arrangement, the voltage sensing circuit illustrated in FIGS. 3 and 4 may be used for three-phase voltage monitoring. FIG. 6 illustrates a voltage sensing circuit 260 for three phase voltage monitoring.

Three-phase monitoring circuit 260 comprises a first voltage sensing circuit 262, a second voltage sensing circuit 264, and an analog adder 268. Three phase voltage sensing circuit 262 scales and galvanically isolates the voltage between Phase C 276 and Phase A 274. Phase A voltage 274 is provided to an inverting input 280 of first voltage sensing circuit 262. Phase C voltage 276 is provided to a non-inverting input 282 of the same circuit 262. Therefore, the output signal 266 of the first voltage sensing circuit 262 represents a difference between Phase C 276 and Phase A 274.

Second voltage sensing circuit 264 operates in a similar manner with respect to the voltage of Phase A 274 and the voltage of Phase B 278. That is, second voltage sensing circuit 264 scales and galvanically isolates the voltage between Phase B 278 and Phase A 274. Phase B voltage 278 is provided to inverting input 284 of second voltage sensing circuit 264. Phase A voltage 274 is input to the non-inverting input 288 of the same circuit 264. Therefore, the output signal 272 of second voltage sensing circuit 264 represents a difference between Phases A 274 and Phase B 278.

Consequently, signal 266 represents the Phase Voltage C-A. Correspondingly, the signal 272 represents the Phase Voltage A-B. Analog Adder 268 is used to restore the Phase Voltage C-B 270. Because signal 270 represents the sum of two signals 266 and 272, it can be noted as follows:

Signal 270=Signal 266+Signal 272=(A–B)+(C–A)=A–B+C–A=C–B

Figure 7:
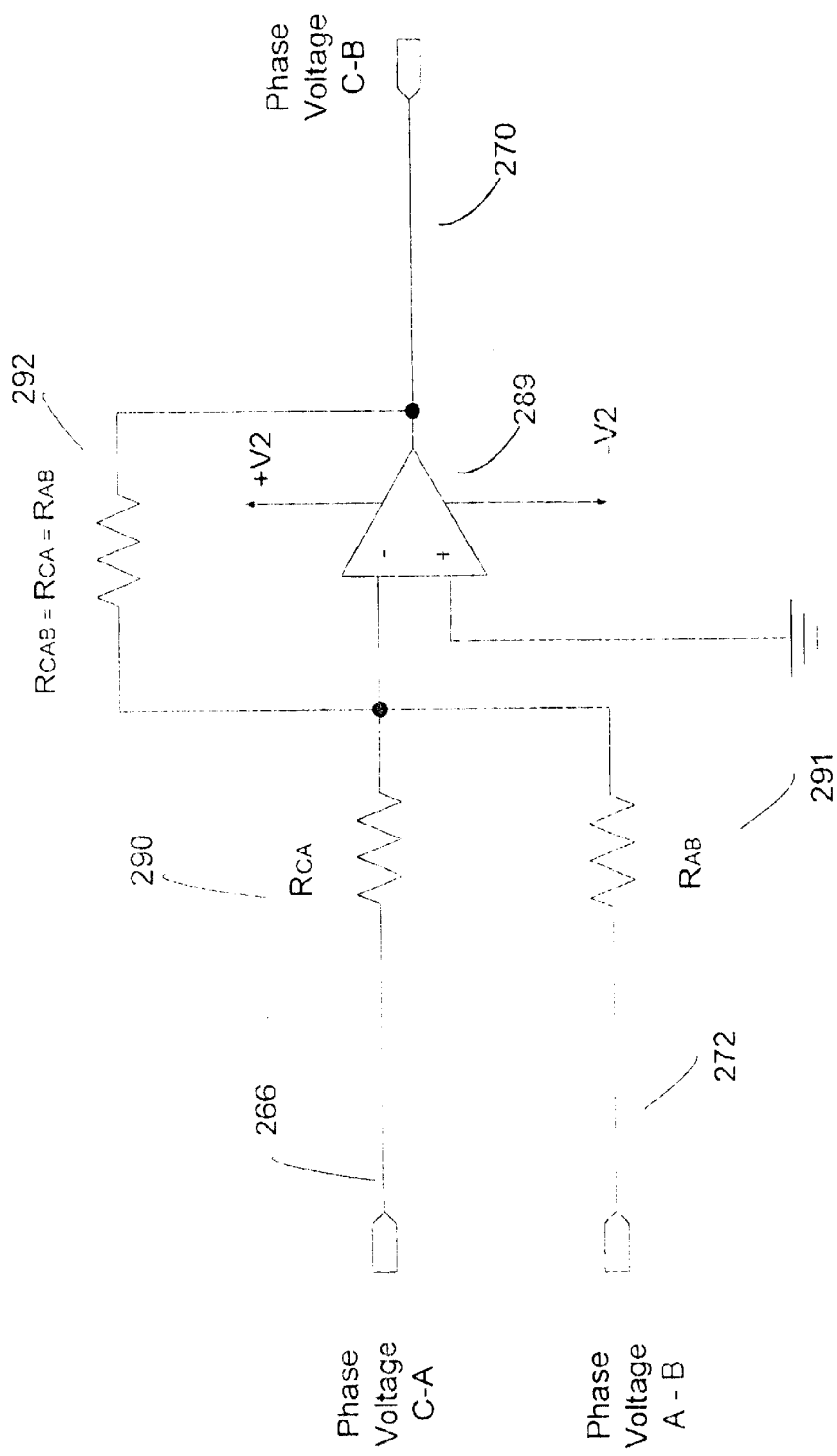
FIG. 7 illustrates an exemplary block diagram of the analog adder illustrated in FIG. 6.

In one preferred arrangement, an operational amplifier may be used as the analog adder. FIG. 7 illustrates an exemplary block diagram of the analog adder illustrated in FIG. 6. In FIG. 7, two signals Phase Voltage C-A 266 and Phase Voltage A-B 272 are provided to a negative input of operational amplifier 289 via resistors 290 and 291. A feedback resistor 292 preferably has the same value as the input resistors.

Exemplary embodiments of the present invention have been described. Those skilled in the art will understand, however, that changes and modifications may be made to these embodiments without departing from the true scope and spirit of the present invention, which is defined by the claims.

I claim:

1. A galvanically isolated voltage sensing circuit, said circuit comprising:
   a scaling device that provides a scaled signal of a input voltage to a modulator;
   an oscillator providing a carrier frequency to said modulator;
   said modulator modulating said scaled signal with said carrier frequency to produce a modulated scaled signal;
   an isolation transformer coupled to an output of said modulator; said isolation transformer receiving said modulated scaled signal; and
   a demodulator coupled to an output of said isolation transformer; said demodulator demodulating said modulated scaled signal to produce an input voltage signal representative of said scaled signal.

2. The invention of claim 1 wherein said isolation transformer comprises a miniature isolation transformer.

3. The invention of claim 1 wherein said scaling device comprises a high impedance voltage divider coupled to a buffer.

4. The invention of claim 3 wherein said buffer comprises a high impedance input buffer and a low impedance output.

5. The invention of claim 1 wherein said modulator also receives a Direct Current bias input.

6. The invention of claim 1 wherein said demodulator comprises a linear rectifier, a low pass filter, and a DC component blocker.

7. The invention of claim 1 wherein said carrier frequency is greater than a frequency of said line voltage.

8. The invention of claim 1 wherein said modulator comprises an AM modulator.

9. The invention of claim 1 wherein said scaling device comprises a resistive voltage divider.

10. The invention of claim 1 wherein said scaling device comprises a capacitive voltage divider.

11. The invention of claim 1 wherein said modulator comprises at least one rail-to-rail switching element.

12. The invention of claim 1 wherein said voltage sensing circuit comprises a three-phase voltage sensing circuit.

13. A method of galvanically isolating a voltage, said method comprising the steps of:
   providing a scaled signal of an input voltage to a modulator;
   generating a carrier frequency and providing said carrier frequency to said modulator;
   producing a modulated scaled signal by modulating said scaled signal with said carrier frequency;
   coupling an isolation transformer to said modulator and a demodulator; said isolation transformer receiving said modulated scaled signal;
   demodulating said modulated scaled signal to produce a line voltage signal representative of said scaled signal.

14. The invention of claim 13 wherein said isolation transformer comprises a miniature isolation transformer.

15. The invention of claim 13 wherein said scaling device comprises a high impedance voltage divider coupled to a buffer.

16. The invention of claim 13 wherein said carrier frequency is greater than a frequency of said line voltage.

17. The invention of claim 13 wherein said carrier frequency is greater than about 1 MHz.

18. The invention of claim 13 wherein said modulator comprises an AM modulator.

19. The invention of claim 13 wherein said modulator comprises an FM modulator.

20. The invention of claim 13 wherein said input voltage comprises a three-phase voltage input.

21. A voltage sensing circuit, said circuit comprising:

a scaling device comprising a high impedance voltage divider coupled to a buffer;

a modulator coupled to an output of said scaling device and receiving a dc bias;

an oscillator coupled to said modulator;

a miniature isolation transformer coupled to an output of said modulator; and a demodulator coupled to an output of said miniature isolation transformer, said demodulator comprising a linear rectifier, a low pass filter, and a DC component blocker;

wherein said demodulator demodulates an input and generates a scaled output line voltage.

22. The invention of claim 21 wherein said voltage sensing circuit comprises a three-phase voltage sensing circuit.

* * * * *